(12) United States Patent
Abys et al.

(10) Patent No.: US 7,883,738 B2
(45) Date of Patent: Feb. 8, 2011

(54) METALLIC SURFACE ENHANCEMENT

(75) Inventors: Joseph A. Abys, Warren, NJ (US);
Shenliang Sun, Bridgewater, CT (US);
Chonglun Fan, Hillsboro, OR (US);
Edward J. Kudrak, Jr., Morganville, NJ (US)

(73) Assignee: Enthone Inc., West Haven, CT (US)

( * ) Notice: Subject to any disclaimer, the term of this patent is extended or adjusted under 35 U.S.C. 154(b) by 676 days.

(21) Appl. No.: 11/736,647

(22) Filed: Apr. 18, 2007

(65) Prior Publication Data
US 2008/0261025 A1 Oct. 23, 2008

(51) Int. Cl.
*B05D 5/12* (2006.01)
*B32B 15/04* (2006.01)

(52) U.S. Cl. .......... 427/58; 428/457; 428/632; 428/674

(58) Field of Classification Search .......... None
See application file for complete search history.

(56) References Cited

U.S. PATENT DOCUMENTS

| | | | |
|---|---|---|---|
| 2,080,299 A | 5/1937 | Benning et al. |
| 3,200,004 A | 8/1965 | Herbst et al. |
| 3,272,662 A | 9/1966 | Herbst et al. |
| 3,365,312 A | 1/1968 | Nowack |
| 3,398,003 A | 8/1968 | Smith et al. |
| 3,630,790 A | 12/1971 | Schmidt et al. |
| 3,837,964 A | 9/1974 | Cotton et al. |
| 3,986,967 A | 10/1976 | Okorodudu |
| 4,000,012 A | 12/1976 | Burrows et al. |
| 4,006,026 A | 2/1977 | Dahms |
| 4,052,160 A | 10/1977 | Cook et al. |
| 4,165,334 A | 8/1979 | Gosselink et al. |
| 4,178,253 A | 12/1979 | Lee et al. |
| 4,181,619 A | 1/1980 | Schmitt et al. |
| 4,209,487 A | 6/1980 | Hogue et al. |
| 4,252,662 A | 2/1981 | Marolewski et al. |
| 4,255,148 A | 3/1981 | Reinwald et al. |
| 4,303,568 A | 12/1981 | May et al. |

(Continued)

FOREIGN PATENT DOCUMENTS

EP 0492487 A1 7/1992

(Continued)

OTHER PUBLICATIONS

International Search Report, PCT/US08/60801, dated Jul. 18, 2008, 2 pages.

(Continued)

*Primary Examiner*—Timothy H Meeks
*Assistant Examiner*—Collette Ripple
(74) *Attorney, Agent, or Firm*—Senniger Powers LLP

(57) ABSTRACT

A method and composition for enhancing corrosion resistance, wear resistance, and contact resistance of a device comprising a copper or copper alloy substrate and at least one metal-based layer on a surface of the substrate. The composition comprises a phosphorus oxide compound selected from the group consisting of a phosphonic acid, a phosphonate salt, a phosphonate ester, a phosphoric acid, a phosphate salt, a phosphate ester, and mixtures thereof; an aromatic heterocycle comprising nitrogen; and a solvent having a surface tension less than about 50 dynes/cm as measured at 25° C.

29 Claims, 7 Drawing Sheets

U.S. PATENT DOCUMENTS

| | | | |
|---|---|---|---|
| 4,329,381 A | | 5/1982 | Eschwey et al. |
| 4,350,600 A | * | 9/1982 | Sharp et al. ............... 507/251 |
| 4,351,945 A | | 9/1982 | Brois et al. |
| 4,357,396 A | | 11/1982 | Grunewalder et al. |
| 4,395,294 A | | 7/1983 | Hobbins et al. |
| 4,649,025 A | | 3/1987 | Hwa et al. |
| 4,734,257 A | | 3/1988 | Penninger |
| 4,744,950 A | | 5/1988 | Hollander |
| 4,865,927 A | * | 9/1989 | Laig-Horstebrock et al. .. 429/50 |
| 4,873,139 A | | 10/1989 | Kinosky |
| 4,908,241 A | | 3/1990 | Quast et al. |
| 5,064,723 A | | 11/1991 | Lawson |
| 5,091,113 A | | 2/1992 | Clubley |
| 5,103,550 A | | 4/1992 | Wefers et al. |
| 5,141,675 A | | 8/1992 | Vanderpool et al. |
| 5,178,916 A | | 1/1993 | Chidsey et al. |
| 5,226,956 A | | 7/1993 | Askew et al. |
| 5,300,247 A | | 4/1994 | Emerich et al. |
| 5,302,304 A | | 4/1994 | Valcho |
| 5,364,460 A | | 11/1994 | Morimoto et al. |
| 5,368,758 A | | 11/1994 | Gapinski |
| 5,463,804 A | | 11/1995 | McCleary et al. |
| 5,487,792 A | | 1/1996 | King et al. |
| 5,555,756 A | | 9/1996 | Fischer et al. |
| 5,618,634 A | | 4/1997 | Hosoda et al. |
| 5,650,385 A | | 7/1997 | Dunn et al. |
| 5,795,409 A | | 8/1998 | Hirao et al. |
| 5,853,797 A | | 12/1998 | Fuchs et al. |
| 6,102,521 A | | 8/2000 | Halko et al. |
| 6,117,795 A | | 9/2000 | Pasch |
| 6,139,610 A | | 10/2000 | Sinko |
| 6,183,815 B1 | | 2/2001 | Enick et al. |
| 6,248,701 B1 | | 6/2001 | Church |
| 6,375,822 B1 | | 4/2002 | Taytsas |
| 6,383,414 B1 | | 5/2002 | Pasch |
| 6,395,329 B2 | | 5/2002 | Soutar et al. |
| 6,461,682 B1 | | 10/2002 | Crotty et al. |
| 6,586,167 B2 | | 7/2003 | Katoh et al. |
| 6,599,445 B2 | | 7/2003 | Meyer |
| 6,627,329 B1 | | 9/2003 | Shintani |
| 6,646,082 B2 | | 11/2003 | Ghosh et al. |
| 6,731,965 B2 | | 5/2004 | Menon et al. |
| 6,773,757 B1 | | 8/2004 | Redline et al. |
| 6,803,349 B2 | | 10/2004 | Negoro et al. |
| 6,863,718 B2 | | 3/2005 | Lamborn et al. |
| 6,869,637 B2 | | 3/2005 | Hutchinson et al. |
| 6,905,587 B2 | | 6/2005 | Redline et al. |
| 6,911,490 B2 | | 6/2005 | Feola et al. |
| 6,923,692 B2 | | 8/2005 | Niebauer |
| 6,933,046 B1 | | 8/2005 | Cook |
| 7,153,445 B2 | | 12/2006 | Bernards et al. |
| 7,351,353 B1 | | 4/2008 | Bernards et al. |
| 7,399,801 B2 | | 7/2008 | Tsuji et al. |
| 7,524,535 B2 | | 4/2009 | Kim et al. |
| 2002/0011280 A1 | | 1/2002 | Nitowski et al. |
| 2004/0048486 A1 | | 3/2004 | Bernards et al. |
| 2005/0181225 A1 | | 8/2005 | Destarac et al. |
| 2005/0217757 A1 | | 10/2005 | Miyano |
| 2005/0239295 A1 | | 10/2005 | Wang et al. |
| 2006/0024430 A1 | | 2/2006 | Yau et al. |
| 2007/0001150 A1 | | 1/2007 | Hudgens et al. |
| 2007/0075120 A1 | | 4/2007 | Yang et al. |
| 2007/0256590 A1 | | 11/2007 | Scott et al. |
| 2008/0108539 A1 | | 5/2008 | Kany et al. |

FOREIGN PATENT DOCUMENTS

| | | | |
|---|---|---|---|
| EP | | 0520649 A2 | 12/1992 |
| GB | | 1209778 | 10/1970 |
| GB | | 2331942 A | 6/1999 |
| JP | | 57198269 A | 12/1982 |
| JP | | 2004042050 A | 2/2004 |
| WO | | 9619097 | 6/1996 |
| WO | | 9718905 A1 | 5/1997 |
| WO | | 03029227 A1 | 4/2003 |
| WO | WO 2007/120259 A2 | * | 10/2007 |

OTHER PUBLICATIONS

Written Opinion of the International Searching Authority, PCT/US08/60801, dated Jul. 18, 2008, 8 pages.

Abstract of JP2004042050; Feb. 12, 2004.

Abstract of JP57198269; Dec. 4, 1982.

Assouli, B. et al., "Effect of 2-mercaptobenzimidazole and its Polymeric Film on the Corrosion Inhibition of Brass (60/40) in Ammonia Solution", Corrosion Science, 2004, vol. 60, No. 4, pp. 399-407.

Cullen, Donald, "Surface Tarnish and Creeping Corrosion on Pb-Free Circuit Board Finishes", 8 pages, <http://members.ipc.org/IPCLogin/IPCMembers/IPC/Review/0106/0106TechArt.pdf>.

Makhlouf et al., "The Synergistic Effect of Halide Ions and Some Selected Thiols as a Combined Corrosion Inhibitor for Pickling ff Mild Steel in Sulphuric Acid Solution", Materials Chemistry and Physics, 1996, vol. 43, No. 1, pp. 76-82.

Mazurkiewicz, Paul, "Accelerated Corrosion of Printed Circuit Boards due to High Levels of Reduced Sulfur Gasses in Industrial Environments", Proceedings of the 23rd International Symposium for Testing and Failure Analysis, Nov. 12-16, 2006, Renaissance Austin Hotel, Austin Texas, USA, pp. 469-473.

Parikh, Atul et al., "An Intrinsic Relationship between Molecular Structure in Self-Assembled n-Alkylsiloxane Monolayers and Deposition Temperature", Journal of Physical Chemistry 1994, vol. 98, 1 page.

Perrin, F. X. et al., "Characterization and Mechanism of Direct Film Formation on a Cu electrode through electro-oxidation of 2-mercaptobenzimidazole", Corrosion Science, 1998, vol. 40, No. 10, pp. 1647-1662.

Song et al., "Synthesis and Characterization of Water-Soluble Polymeric Adhesion Promoter for Epoxy Resin/Copper Joints", Journal of Applied Polymer Science, vol. 85 Issue 10, Sep. 2002, pp. 2202-2210.

Song et al., "Adhesion Improvement of Epoxy Resin/Copper Lead Frame Joints by Azole Compounds", Journal of Adhesion Science and Technology, vol. 12, No. 5, 1998, pp. 541-561.

Tompkins et al., "The Interaction of Imidazole, Benzimidazole and Related Azoles with a Copper Surface", Surface and Interface Analysis, vol. 4, Issue 6, Dec. 1982, pp. 261-266.

Trachli, B., et al., "Protective Effect of Electropolymerized 2-Mercaptobenzimidazole upon Copper Corrosion", Progress in Organic Coating, 2002, Vol. 44, pp. 17-23.

Veale, Robert, "Reliability of PCB Alternate Surface Finishes in a Harsh Industrial Environment", Proceedings of the SMTA International Conference, Sep. 25, 2005, 6 pages.

Xue, Gi, et al., "Various Adsorption States of 2-Mercaptobenzimidazole on the Surface of Gold and Silver Studied by Surface Enhanced Raman Scattering", Langmuir, 1994, vol. 10, No. 3, pp. 967-969.

Xue, Gi, et al., "Surface Reaction of 2-Mercaptobenzimidazole on Metals and its application in Adhesion Promotion", Journal of the Chemical Society Faraday Transactions, 1991, vol. 87, No. 8, pp. 1229-1232.

International Preliminary Report on Patentability, PCT/US2008/060801, dated Oct. 20, 2009, 9 pages.

* cited by examiner

METALLIC SURFACE ENHANCEMENT

FIELD OF THE INVENTION

This invention relates to methods and compositions which improve wear resistance, corrosion resistance, and contact resistance of metallic surfaces.

BACKGROUND OF THE INVENTION

Metallic surface coatings are commonly applied to electronic devices and decorative objects to provide corrosion protection and other desired functional properties. Electronic devices comprising copper or copper alloys typically comprise metallic surface coatings which provide corrosion protection, high surface contact resistance, and wear resistance. To meet these requirements, the connectors industry has developed surface coatings comprising one or more metallic layers. For example, a metallic surface coating can comprise a base metal underlayer and a precious metal overlayer. The base metal underlayer, such as a nickel underlayer, is coated over the copper or copper alloy substrate. The base metal serves as a diffusion barrier. The precious metal overlayer, such as gold, palladium, or alloys thereof, is then coated over the base metal underlayer coating. The precious metal overlayer provides corrosion resistance, wear resistance, and high conductivity. In a known metallic surface coating, a nickel underlayer increases the hardness of a gold overlayer. This metallic surface is commonly referred to as "nickel-hardened gold" or simply, "hard gold." Variations on these coatings involve base metal alloy underlayers, precious metal alloy overlayers, and metallic surface coatings comprising two or more base metal underlayers and/or two or more precious metal overlayers.

An obvious disadvantage to the use of precious metals such as gold and palladium is cost. A cost effective connector uses a precious metal coating layer which is as thin as possible, without sacrificing the desired functional properties. Accordingly, the industry typically employs precious metal layer on the order of about 1.0 µm thick on electronic connectors. Thinner layers suffer from the disadvantage of highly increased porosity in the coating. Over time in service, the thin layers having a high degree of porosity are ineffective against base metal and copper diffusion to the surface. In a corrosive environment, the exposed base metal and copper will corrode and the corrosion product(s) can migrate onto the coating surface and deteriorate the surface contact conductivity. Moreover, a thin precious metal layer can wear off during application and shorten the connector's useful lifetime.

For many years, bare boards comprising copper circuitry were finished with eutectic tin-lead solder coating according to the Hot Air Solder Leveling (HASL) process. Due to the Restriction of Hazardous Substances (ROHS) directive, the industry has moved away from using lead as a component of the final finish of bare boards. One alternative final is electroless nickel-immersion gold (ENIG). ENIG is vulnerable to common pollutants and is sensitive to high humidity and tends to fail due to corrosion.

In a reported treatment of nickel-hardened gold surface coatings over copper alloy devices, alkyl phosphonates were applied to the metallic surface coating to block pores in the gold overlayer. See U.S. Pat. No. 5,853,797. The alkyl phosphonates chemically bonded to exposed nickel (through pores in the gold overlayer) and thereby inhibited nickel corrosion.

In a reported treatment of copper alloys to prevent corrosion, aromatic heterocycles comprising nitrogen such as imidazole and benzimidazole were applied to a copper alloy surface to inhibit copper oxidation and preserve solderability of the copper alloy surface. See U.S. Pat. Nos. 4,395,294 and 5,795,409.

A need continues to exist in the connectors industry for a metallic coating surface which uses as little precious metal as possible while still retaining advantages the precious metal overlayer provides. Moreover, a need continues to exist for an ENIG finish over copper circuitry in PCB manufacture that is less vulnerable to corrosion.

SUMMARY OF THE INVENTION

Among the aspects of the present invention may be noted a composition and method for enhancing the wear resistance, corrosion resistance, and contact resistance of a copper or copper alloy device which is coated with a base metal layer. The base metal layer may, in turn, be a base metal underlayer that is coated with an ultra-thin precious metal overlayer.

Briefly, therefore, the invention is directed to a composition for enhancing corrosion resistance, wear resistance, and contact resistance of a device comprising a copper or copper alloy substrate and at least one metal-based layer on a surface of the substrate. The composition comprises a phosphorus oxide compound selected from the group consisting of a phosphonic acid, a phosphonate salt, a phosphonate ester, a phosphoric acid, a phosphate salt, a phosphate ester, and mixtures thereof; an aromatic heterocycle comprising nitrogen; and a solvent having a surface tension less than about 50 dynes/cm as measured at 25° C.

The invention is further directed to a method for enhancing the corrosion resistance, wear resistance, and contact resistance of a device comprising a copper or copper alloy substrate and a metal-based layer on a surface of the substrate. The method comprises exposing the device to a composition comprising a phosphorus oxide compound selected from the group consisting of a phosphonic acid, a phosphonate salt, a phosphonate ester, a phosphoric acid, a phosphate salt, a phosphate ester, and mixtures thereof; an aromatic heterocycle comprising nitrogen; and a solvent having a surface tension less than about 50 dynes/cm as measured at 25° C.

The invention is further directed to an electronic device comprising a copper substrate having a surface and a base metal underlayer having a surface deposited on the surface of the copper substrate. The surface of the copper substrate comprises a first protective organic film comprising an aromatic heterocycle comprising nitrogen. The surface of the base metal underlayer comprises a second protective organic film comprising a phosphorus oxide compound selected from the group consisting of a phosphonic acid, a phosphonate salt, a phosphonate ester, a phosphoric acid, a phosphate salt, a phosphate ester, and mixtures thereof.

Other objects and features of the invention will be in part apparent and in part pointed out hereinafter.

DETAILED DESCRIPTION OF PREFERRED EMBODIMENT(S)

The present invention is directed to a surface treatment method and a surface treatment composition for applying a protective organic film to a metallic surface coating, particularly a metallic surface coating on a copper substrate. The surface treatment has been found effective in enhancing the corrosion resistance, contact resistance, and wear resistance of a metallic surface coating comprising a precious metal overlayer significantly thinner than 1.0 μm. Copper substrates suitable for protection with the organic protective film of the invention include copper circuitry in printed circuit boards (PCB), chip carriers, semiconductor substrates, metal lead frames, connectors, and other solderable copper substrates. An exemplary metallic surface coating comprises a base metal layer. Another exemplary metallic surface coating comprises a base metal underlayer and a precious metal overlayer.

The surface treatment method comprises exposing the copper substrate having a metallic surface coating to a surface treating composition comprising additives which are effective at blocking pores which may be present in the base metal underlayer and, if present, the precious metal overlayer. Accordingly, the compositions of the present invention can effectively block pores down to the copper or copper alloy substrate. This enhanced pore blocking is more effective for inhibiting corrosion, enhancing wear and contact resistance, and prolonging the useful service life of electronic devices in comparison with compositions known in the art. Although this invention is described in the context of electronic devices, the surface treatment method and surface treatment composition are applicable to any object comprising a copper or copper alloy substrate with a metallic surface coating thereon.

The present invention is therefore further directed to such a surface treatment composition. The surface treatment composition for use in the surface treatment of the present invention comprises a phosphorus oxide compound, an aromatic heterocycle comprising nitrogen, and a solvent. Optionally, the composition further comprises an alkyl thiol, which provides additional protection over the copper and copper alloy substrate and, if present, a precious metal overlayer. Preferably, the solvent is a low surface tension solvent.

Figure 1:
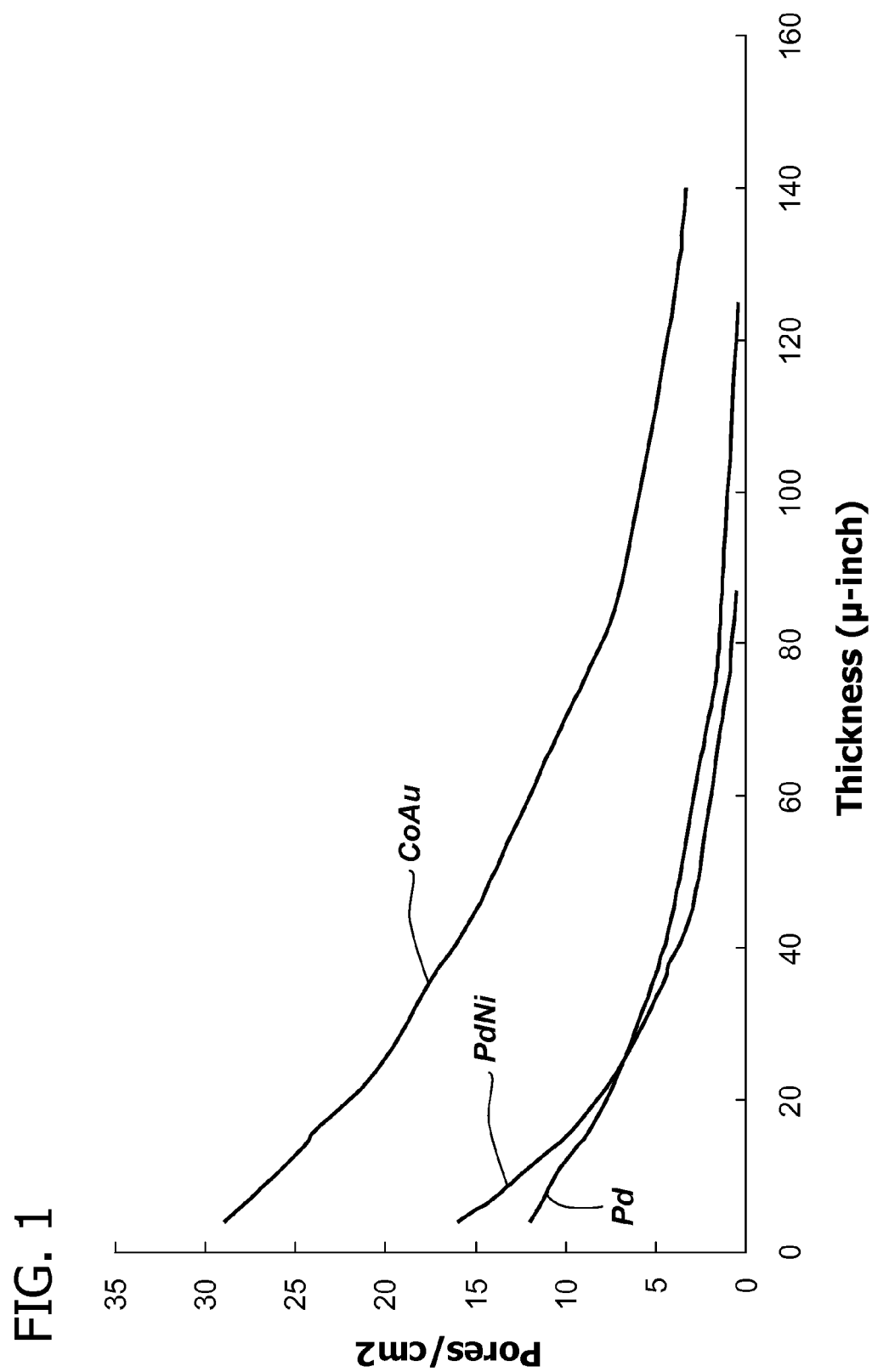
FIG. 1 is a graph showing the increase in porosity as a film comprising cobalt-hardened gold decreases in thickness.

The surface treating composition of the present invention comprises a phosphorus oxide compound. The phosphorus oxide compound is added to the surface treatment composition to react with and impart a protective organic film over a base metal layer. The phosphorus oxide compound may also fill in pores which may be present in a precious metal overlayer. In order to achieve cost-savings, if used, the precious metal overlayer is preferably ultra-thin, i.e., substantially thinner than the approximately 1 μm to 2 μm thick precious metal coatings known in the art. The drawback to thin precious metal overlayers is rapidly increasing porosity as a function of decreases in thickness. See FIG. 1, which is a graph showing porosity increases as the thickness of the precious metal overlayer decreases. Porosity increases are especially notable at thicknesses below 1 μm. Accordingly, phosphorous oxide compounds are added to the surface treating composition of the present invention to react with base metal exposed by pores in the precious metal overlayer. The base metal exposed by pores in the precious metal overlayer can be easily oxidized in an oxygen-containing corrosive environment, such that it contains metal oxides and metal hydroxides on its surface. Advantageously, base metal oxide and metal hydroxide on the surface of the base metal layer reacts with phosphorous oxide compounds to form a chemical bond between the metal oxide and metal hydroxide and phosphorus oxide compound. The reaction between an exemplary base metal, such as nickel having surface hydroxides, and an exemplary phosphorus oxide occurs as shown:

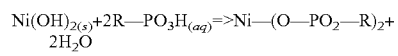

$$Ni(OH)_{2(s)} + 2R-PO_3H_{(aq)} \Rightarrow Ni-(O-PO_2-R)_2 + 2H_2O$$

Figure 2:
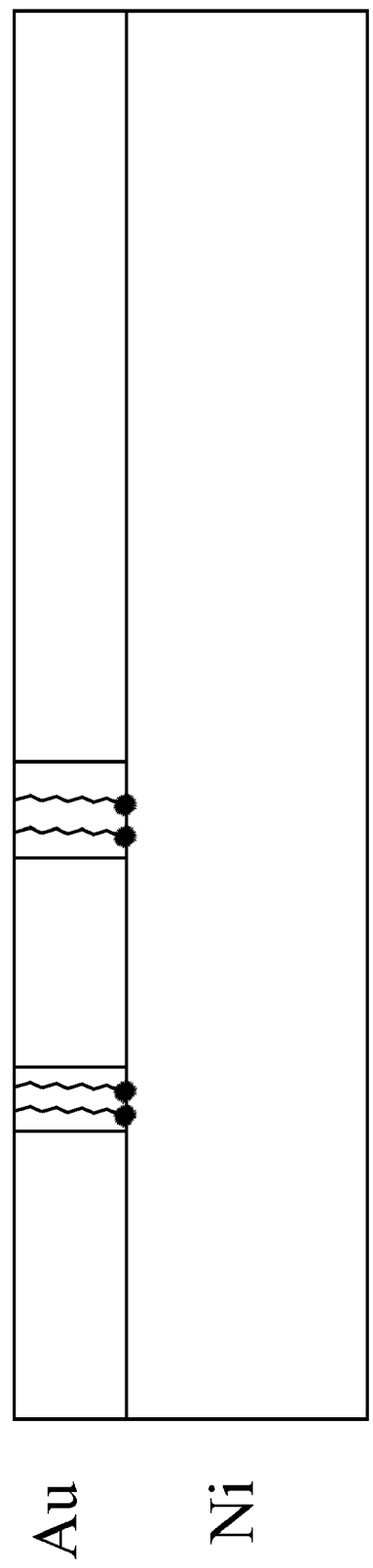
FIG. 2 is a depiction of a phosphorus oxide compound forming a protective film over a nickel underlayer by reacting with nickel oxide which may be present on the surface of the nickel underlayer. The phosphorus oxide compound further fills in pores in the gold overlayer.

Each phosphorus oxide having the general structure shown in the above reaction can react with one, two, or three oxygen atoms on the surface of the base metal layer. The reaction causes the phosphorus oxide compound to be chemically bonded to the base metal oxide on the surface of the base metal layer while also filling in pores in the precious metal underlayer as shown in FIG. 2.

Phosphorus oxide compounds suitable for adding to the surface treating compositions of the present invention preferably have a structure similar to micellular surfactants, i.e., having a hydrophilic head group and a relatively long hydrophobic chain. The long hydrophobic chain better fills in pores in the precious metal overlayer as compared to phosphorus oxide compounds having a short or non-existent hydrophobic chain. Accordingly, the phosphorus oxide compounds preferably comprise phosphate or phosphonate moieties bonded to a hydrophobic group. For example, the hydrophobic group bonded to the phosphate or phosphonate moiety can be an alkyl group, an aryl group, an arylalkyl, or an alkylaryl group.

An exemplary phosphorus oxide compound is a phosphonate derivative having the following general structure (I):

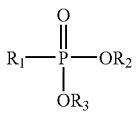

Structure (I)

wherein $R_1$ is a hydrocarbyl having between two carbon atoms and 24 carbon atoms; and $R_2$ and $R_3$ are each independently or together hydrogen, a charge balancing cation, or a hydrocarbyl having between one carbon atom and four carbon atoms. The $R_1$ hydrocarbyl may be branched-chained or straight-chained, substituted or unsubstituted. The $R_1$ hydrocarbyl may comprise alkyl, alkenyl, alkynyl, aryl, or combinations thereof, such as alkylaryl or arylalkyl. For example, the $R_1$ hydrocarbyl may comprise a phenyl group bonded to the phosphorus atom to which is bonded a hydrocarbyl chain, such as an alkyl chain having from two to 18 carbon atoms. In another example, the $R_1$ hydrocarbyl may comprise an alkyl chain having from two to 18 carbon atoms bonded to the phosphorus atom and further comprising a phenyl group. Preferably, the $R_1$ hydrocarbyl comprises an alkyl chain comprising between about two carbon atoms and about 24 carbon atoms, more preferably between about two carbon atoms and 22 carbon atoms, even more preferably between about six carbon atoms and about 18 carbon atoms.

Unless otherwise indicated, a substituted hydrocarbyl is substituted with at least one atom other than carbon, including moieties in which a carbon chain atom is substituted with a hetero atom such as nitrogen, oxygen, silicon, phosphorous, boron, sulfur, or a halogen atom. The hydrocarbyl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters, and ethers.

$R_2$ and/or $R_3$ may be hydrogen; in this case, the phosphorus oxide compound is a phosphonic acid. $R_2$ and/or $R_3$ may be a charge balancing metal cation such as lithium, potassium, sodium, or calcium. The charge balancing cation may also be ammonium. When $R_2$ and/or $R_3$ comprise charge balancing cation, the phosphorus oxide compound is a phosphonate salt. $R_2$ and/or $R_3$ may be a hydrocarbyl such as methyl, ethyl, n-propyl, isopropyl, n-butyl, isobutyl, and tert-butyl. When $R_2$ and/or $R_3$ are hydrocarbyl, the phosphorus oxide compound is a phosphonate ester.

Another exemplary phosphorus oxide compound is a phosphate derivative having the following general structure (II):

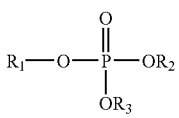

Structure (II)

wherein $R_1$ is a hydrocarbyl having between two carbon atoms and 24 carbon atoms; and $R_2$ and $R_3$ are each independently or together hydrogen, a charge balancing cation, or a hydrocarbyl having between one carbon atom and four carbon atoms. The $R_1$ hydrocarbyl may be branched-chained or straight-chained, substituted or unsubstituted. The $R_1$ hydrocarbyl may comprise alkyl, alkenyl, alkynyl, aryl, or combinations thereof, such as alkylaryl or arylalkyl. For example, the $R_1$ hydrocarbyl may comprise a phenyl group bonded to the phosphorus atom to which is bonded a hydrocarbyl chain, such as an alkyl chain having from two to 18 carbon atoms. In another example, the $R_1$ hydrocarbyl may comprise an alkyl chain having from two to 18 carbon atoms bonded to the phosphorus atom and further comprises a phenyl group. Preferably, the $R_1$ hydrocarbyl comprises an alkyl chain comprising between about two carbon atoms and about 24 carbon atoms, more preferably between about two carbon atoms and 22 carbon atoms, even more preferably between about six carbon atoms and about 18 carbon atoms.

Unless otherwise indicated, a substituted hydrocarbyl is substituted with at least one atom other than carbon, including moieties in which a carbon chain atom is substituted with a hetero atom such as nitrogen, oxygen, silicon, phosphorous, boron, sulfur, or a halogen atom. The hydrocarbyl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters, and ethers.

$R_2$ and/or $R_3$ may be hydrogen; in this case, the phosphorus oxide compound is a phosphoric acid. $R_2$ and/or $R_3$ may be a charge balancing metal cation such as lithium, potassium, sodium, or calcium. The charge balancing cation may also be ammonium. When $R_2$ and/or $R_3$ comprise charge balancing cation, the phosphorus oxide compound is a phosphate salt. The $R_2$ and/or $R_3$ may be a hydrocarbyl such as methyl, ethyl, n-propyl, isopropyl, n-butyl, isobutyl, and tert-butyl. When $R_2$ and/or $R_3$ are hydrocarbyl, the phosphorus oxide compound is a phosphate ester.

The phosphorus oxide compound can be a phosphonic acid, a phosphonate salt, a phosphonate ester, a phosphoric acid, a phosphate salt, a phosphate ester, or a mixture thereof. Exemplary phosphorus oxide compounds having phosphonate moieties include n-decyl phosphonic acid, n-dodecyl phosphonic acid, n-tetradecyl phosphonic acid, n-hexadecyl phosphonic acid, n-octadecyl phosphonic acid, their salts, and their esters. Exemplary phosphorus oxide compounds having phosphate moieties include n-decyl phosphoric acid, n-dodecyl phosphoric acid, n-tetradecyl phosphoric acid, n-hexadecyl phosphoric acid, n-octadecyl phosphoric acid, their salts, and their esters. Among the suitable compounds are, for example, decylphosphonic acid, octylphosphonic acid, vinylphosphonic acid, a petroleum 10 naphtha (ZC-026) from Zip-Chem Products (Morgan Hill, Calif.), and bifunctional molecules such as phosphonic acid compounds comprising carboxylic acid moieties.

The phosphorus oxide compound is added to the surface treating compositions of the present invention at a concentration between about 0.01% by weight and about 10% by weight, preferably between about 0.1% by weight and about 5% by weight, more preferably between about 0.1% by weight and about 2% by weight. The phosphorus oxide compound is preferably added to the composition in at least about 0.1 g/L by weight because to achieve rapid coating. The maximum concentration of about 100 g/L is determined by the phosphorus oxide compound's solubility and therefore may be higher or lower than the stated amount depending upon the identity of the phosphorus oxide compound. In a preferred composition, the compound is n-octadecyl phosphonic acid added in a concentration between about 2.0 g/L and about 20.0 g/L for example, about 12.4 g/L.

Figure 3:
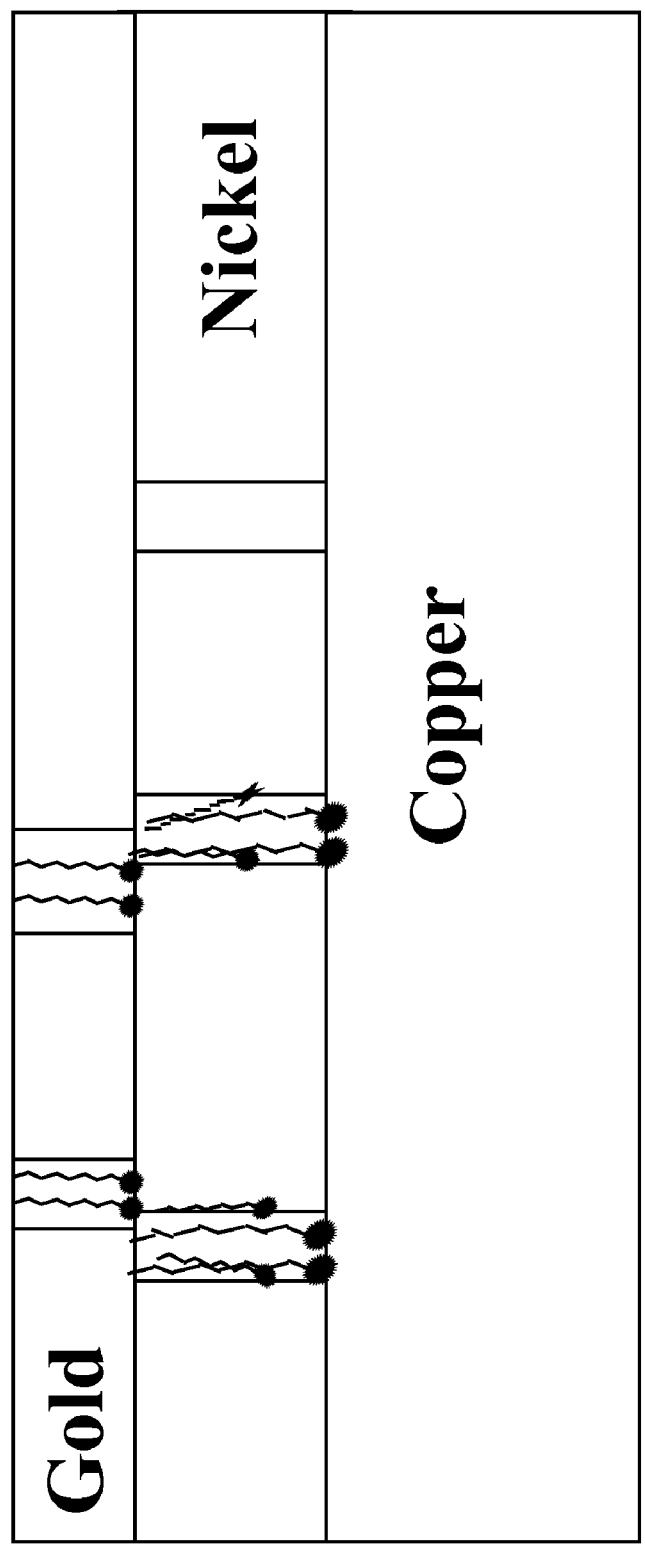
FIG. 3 is a depiction of a phosphorus oxide compound forming a protective film over a nickel underlayer by reacting with nickel oxide which may be present on the surface of the nickel underlayer and an aromatic heterocycle comprising nitrogen forming a protective film over a copper or copper alloy substrate by reacting with surface copper. The phosphorus oxide compound further fills in pores in the gold overlayer and the aromatic heterocycle comprising nitrogen fills in pores in the nickel underlayer.
Figure 4:
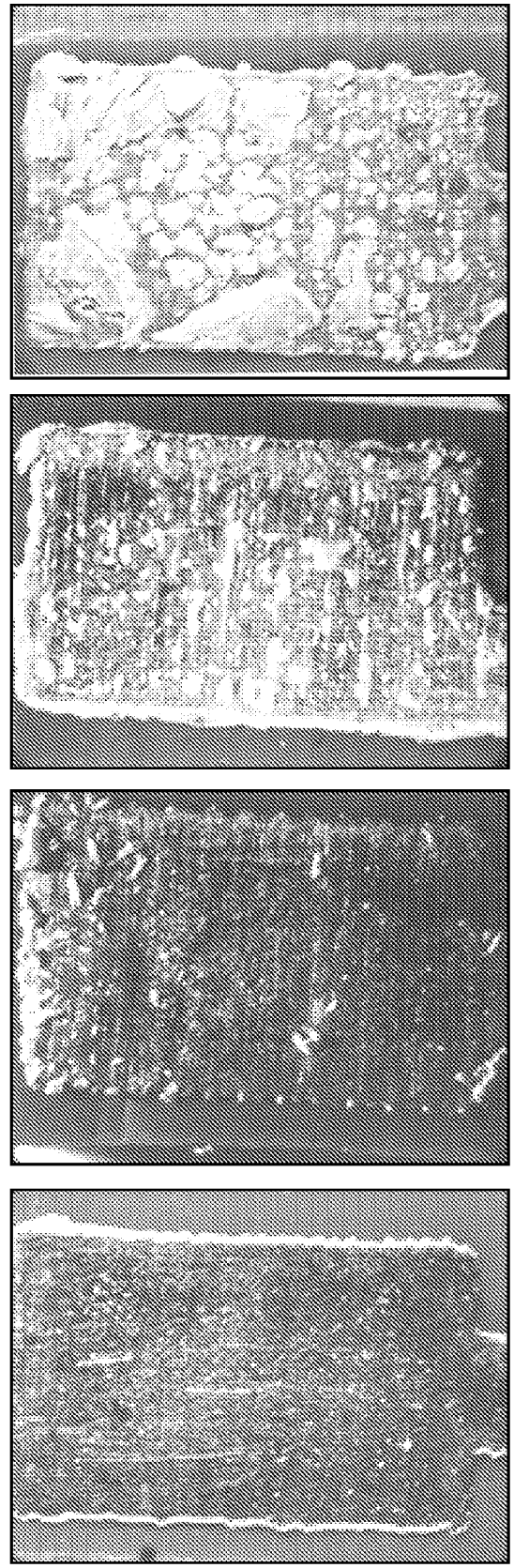
FIG. 4 are examples of electronic connectors showing light (A), moderate (B), severe (C), and total (D) surface coverage of copper oxides which developed over their service lives and which can be attributed to porous metallic surface coatings.

The surface treating composition of the present invention further comprises an aromatic heterocycle comprising nitrogen. The aromatic heterocycle comprising nitrogen is added to the surface treatment composition to react with and protect the copper or copper alloy substrate. While ultra-thin precious metal overlayers are characterized by increased porosity (see FIG. 1), the base metal underlayer may also be characterized by a certain degree of porosity. Accordingly, it has been observed that continuous pores may exist through the precious metal overlayer and base metal. Refer to FIG. 3 for a depiction of pores which penetrate through to the copper or copper alloy substrate. Porous base metal underlayers and precious metal overlayers characterized by pores which penetrate to the copper or copper alloy substrate are ineffective at inhibiting copper diffusion from the substrate to the surface and are ineffective at protecting the copper from corrosion. Accordingly, over time, copper (I) and (II) oxides may form and cover the surfaces of electronic connectors and PCB substrates. Severe oxide formation can render electronic connectors non-conductive and useless for their intended purpose. See FIG. 4 for examples of electronic connectors showing light (A), moderate (B), severe (C), and total (D) surface coverage of copper oxides which developed over their service lives and which can be attributed to porous metallic surface coatings.

Because of problems relating to the porosity of the base metal underlayer, surface treating the electronic connector with a composition comprising a phosphorus oxide compound may be insufficient to prevent corrosion related copper oxide coverage of the component surface. Accordingly, the compositions of the present invention further comprise an aromatic heterocycle comprising nitrogen, which reacts with the copper or copper alloy substrate and fills in pores in the base metal underlayer. Pore blocking using aromatic heterocycles comprising nitrogen provides further protection against copper diffusion to the surface of the electronic connector. Copper ions can form complexes with amine compounds. Some of these complexes, such as the complex between copper ions and benzotriazole, are insoluble. Without being bound to a particular theory, it is thought that upon exposure of the copper or copper alloy surface, copper(I) ions on the copper surface and copper(II) ions in solution complex with the nitrogen in the aromatic heterocycle. These complexes precipitate over the copper surface, forming a protective film over exposed areas of the copper or copper alloy.

Aromatic heterocycles comprising nitrogen suitable for the surface treatment compositions of the present invention comprise nitrogen in a 5-membered ring (azoles). The 5-membered can be fused to another 5-membered or 6-membered aromatic ring, which can also be a heterocyclic ring comprising a nitrogen atom. Further, the aromatic heterocycle can comprise one or more nitrogen atoms, and typically, the aromatic heterocycle comprises between one and four nitrogen atoms. Azoles can have the following structure (III):

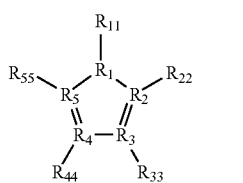

Structure (III)

wherein $R_1$, $R_2$, $R_3$, $R_4$, and $R_5$ is an atom selected from the group consisting of carbon and nitrogen wherein between one and four of the $R_1$, $R_2$, $R_3$, $R_4$, and $R_5$ groups are nitrogen and between one and four of the $R_1$, $R_2$, $R_3$, $R_4$, and $R_5$ groups are carbon; and $R_{11}$, $R_{22}$, $R_{33}$, $R_{44}$, and $R_{55}$ are each independently selected from the group consisting of hydrogen, carbon, sulfur, oxygen, and nitrogen.

Any one or more of $R_{11}$, $R_{22}$, $R_{33}$, $R_{44}$, and $R_{55}$ of structure (III) may be carbon wherein the carbon is part of an aliphatic group having between one carbon atom and 24 carbon atoms or part of an aryl group having between two carbon atoms and fourteen carbon atoms. The aliphatic group and the aryl group may be substituted or unsubstituted. The aliphatic group may be branched-chained or straight-chained. Unless otherwise indicated, a substituted aliphatic group or substituted aryl group is substituted with at least one atom other than carbon, including moieties in which a carbon chain atom is substituted with a hetero atom such as nitrogen, oxygen, silicon, phosphorous, boron, sulfur, or a halogen atom. The aliphatic group or aryl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters, and ethers.

In structure (III), any pair of consecutive $R_{11}$, $R_{22}$, $R_{33}$, $R_{44}$, and $R_{55}$ (e.g., $R_{11}$ and $R_{22}$ or $R_{22}$ and $R_{33}$) can together with the carbon or nitrogen atoms to which they are bonded form a substituted or unsubstituted cycloalkyl or substituted or unsubstituted aryl group with the corresponding pair of consecutive $R_1$, $R_2$, $R_3$, $R_4$, and $R_5$ (e.g., $R_{11}$ and $R_{22}$ form a ring with $R_1$ and $R_2$) such that the ring defined by the $R_1$, $R_2$, $R_3$, $R_4$, and $R_5$ groups is fused to another ring. This ring can comprise between one or two nitrogen atoms.

Preferably, the consecutive $R_{11}$, $R_{22}$, $R_{33}$, $R_{44}$, and $R_{55}$ and the corresponding consecutive $R_1$, $R_2$, $R_3$, $R_4$, and $R_5$ form a six-membered aromatic ring.

Preferably, the azole of structure (III) is not substituted. Exemplary azoles are shown in Table I. Preferred azoles from among those listed in Table I include imidazole (1,3-diazole), benzimidazole (1,3-benzodiazole), 1H-benzotriazole, and 2H-benzotriazole.

TABLE 1

| Azoles | |
|---|---|
| Name | Structure |
| Pyrrole (1H-azole) | |
| Imidazole (1,3-diazole) | |
| Pyrazole (1,2-diazole) | |
| 1,2,3-triazole | |

TABLE 1-continued

Azoles

| Name | Structure |
|---|---|
| Benzimidazole (1,3-benzodiazole) | 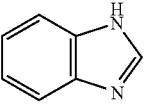 |
| Indazole (1,2-benzodiazole) | 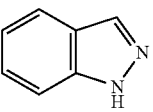 |
| 1H-Benzotriazole | 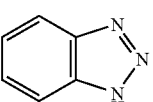 |
| 2H-Benzotriazole | 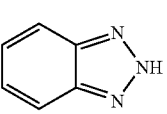 |
| 1,2,4-triazole | 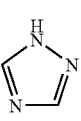 |
| Tetrazole | 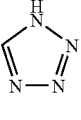 |
| Isoindole | 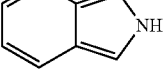 |
| Indole (1H-Benzo[b]pyrrole) | 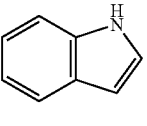 |
| Imidazo[4,5-b]pyridine | 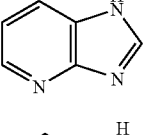 |
| Purine (7H-Imidazo(4,5-d)pyrimidine) | 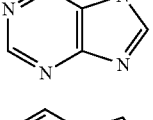 |
| Pyrazolo[3,4-d]pyrimidine | 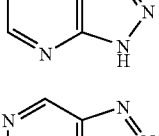 |
| Triazolo[4,5-d]pyrimidine | 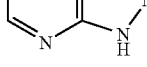 |

The aromatic heterocycle comprising nitrogen may be added to the surface treating compositions of the present invention at a concentration between about 0.01% by weight and about 10% by weight, preferably between about 0.1% by weight and about 1.0% by weight. The heterocycle may be added to the composition in at least 0.1 g/L to achieve sufficient coverage and protection of the copper substrate. The maximum concentration of about 100 g/L is an estimate based on the heterocyclic aromatic compound's solubility and therefore may be higher or lower than the stated amount depending upon the identity of the heterocyclic aromatic compound. In a preferred composition, the heterocycle is benzotriazole added in a concentration between about 1 g/L and about 10 g/L, for example, about 3 g/L.

The above-described phosphorus oxide compounds and aromatic heterocycles comprising nitrogen are dissolved in a solvent. The solvent preferably has a low surface tension so that the composition can adequately cover the surface of the electronic connector and wet pores which can exist in the precious metal overlayer and base metal underlayer. Adequate wetting of the pores in these surface metallic layers is important to the efficacy of the composition of the invention. That is, adequate wetting of the pores allows the additives in the surface treating composition to penetrate into the pores and react with base metal oxides and the surface of the copper or copper alloy substrates. Moreover, the solvent is preferably a hydrophobic solvent such that it can adequately dissolve the hydrophobic components of the surface treating composition, in particular long hydrocarbon chain n-alkyl phosphonic acids.

Applicable solvents preferably have a surface tension below about 50 dynes/cm as measured at 25° C. (Unit conversion: 1 dyne/cm=1 nN/m; Surface tension standard test ASTM D971.) Preferably, the surface tension of the solvent is below about 45 dynes/cm as measured at 25° C., more preferably, the surface tension of the solvent is below about 40 dynes/cm as measured at 25° C., such as below about 35 dynes/cm as measured at 25° C. Low surface tension solvents are advantageous both from a solubility standpoint and a wetting standpoint. Low surface tension solvents allow the surface treating composition of the present invention to penetrate into any pores that may be present on the protective metallic surface coating. Preferred solvents include ISO-PAR® solvents, naphthenic oils, alcohols such as 2-octanol, and water with added surfactants.

A class of solvents having low surface tension is paraffinic and isoparaffinic mineral oil solvents sold under the trade name ISOPAR® (Exxon Mobil Corporation, Fairfax, Va.). Applicable ISOPAR solvents include ISOPAR-C, ISOPAR-E, ISOPAR-G, ISOPAR-H, ISOPAR-K, ISOPAR-L, ISO-PAR-M, and ISOPAR-V. All of these ISOPAR® solvents have surface tensions below 30 dynes/cm as measured at 25° C.

Another class of low surface tension solvents is naphthenic oils, such as those sold under the trade name RENOIL (Renkert Oil, Elverson, Pa.). Naphthenic oils are characterized by highly saturated cycloalkanes. Applicable RENOIL solvents include 40-S, 60B, 100HT, 200-S, 535, 775-S, 2000-S, and 3710.

Additional applicable solvents include high boiling point alcohols, having a boiling point preferably at least about 90° C., and preferably at least about 110° C., even more preferably at least about 150° C. Exemplary high boiling point alcohols for use in the OSP compositions of the present invention include those having four or more carbon atoms, such as n-propanol, isopropanol, 1-butanol, 2-butanol, tert-butanol, iso-butanol, 1-pentanol, 2-pentanol, other pentanols, 1-hexanol, other hexanols, heptanols, 1-octanol, 2-octanol, and other octanols, 1-decanol and other decanols, phenol, benzyl alcohol, furfuryl alcohol, and tetrahydrofurfuryl alcohol.

The surface treating composition of the present invention optionally comprises a sulfur containing compound which may be a thiol or a disulfide. The sulfur containing compound is added to react with and protect, if present, a precious metal overlayer. The sulfur containing compound can also react with the copper or copper alloy substrate to further protect the copper and fill in pores in the base metal layer.

The sulfur containing compound can be a thiol or a disulfide. Thiols can have the following structure (IV):

Structure (IV)

wherein $R_1$ is a hydrocarbyl having between one carbon atom and about 24 carbon atoms. The hydrocarbyl preferably comprises between about six carbon atoms and about 18 carbon atoms. The hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, napthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ hydrocarbyl is not substituted with other groups and is a straight chained alkyl, since straight-chained alkyl better achieves a desirable densely packed self-assembled monolayer on the precious metal overlayer. Exemplary alkyl thiols include ethyl mercaptan, n-propyl mercaptan, isopropyl mercaptan, n-butyl mercaptan, sec-butyl mercaptan, isobutyl mercaptan, tert-butyl mercaptan, n-pentyl mercaptan, n-hexyl mercaptan, n-heptyl mercaptan, n-octyl mercaptan, n-nonyl mercaptan, n-decyl mercaptan, n-dodecyl mercaptan, n-tetradecyl mercaptan, n-hexadecyl mercaptan, and n-octadecyl mercaptan.

Disulfides can be formed by the oxidation of two thiols and can have the following structure (V):

Structure (V)

wherein $R_1$ and $R_2$ are hydrocarbyls having between one carbon atom and about 24 carbon atoms. The hydrocarbyls preferably comprise between about six carbon atoms and about 18 carbon atoms. The hydrocarbyls may be substituted or unsubstituted. Typical substituents include short carbon chain branching alkyl groups, typically having from one to four carbon atoms, i.e., methyl, ethyl, propyl, and butyl substituents and aromatic groups such as phenyl, napthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ and $R_2$ hydrocarbyls are not substituted with other groups and are straight chained alkyls, since straight-chained alkyls better achieve a desirable densely packed self-assembled monolayer on the precious metal overlayer. Exemplary disulfides include diethyl disulfide, di-n-propyl disulfide, diisopropyl disulfide, di-n-butyl disulfide, di-sec-butyl disulfide, diisobutyl disulfide, di-tert-butyl disulfide, di-n-pentyl disulfide, di-n-hexyl disulfide, di-n-heptyl disulfide, di-n-octyl disulfide, di-n-nonyl disulfide, di-n-decyl disulfide, di-n-dodecyl disulfide, di-n-tetradecyl disulfide, di-n-hexadecyl disulfide, and di-n-octadecyl disulfide.

The sulfur containing compound may be added to the surface treating compositions of the present invention at a concentration between about 0.01% by weight and about 10% by weight, preferably between about 0.1% by weight and about 1.0% by weight. The sulfur containing compound is added to the composition in at least 0.1 g/L to achieve adequate coverage and protection of the precious metal overlayer. The maximum concentration of about 100 g/L is an estimate based on the sulfur containing compound's solubility and therefore may be higher or lower than the stated amount depending upon the identity of the sulfur containing compound. In a preferred composition, the sulfur containing compound is n-octadecyl thiol added in a concentration between about 0.5 g/L and about 10.0 g/L, for example, about 5.0 g/L.

Electronic devices applicable for surface treatment with the compositions of the present invention are typically copper or copper alloy wires and electronic connectors. Additional substrates include copper circuitry in printed circuit boards. These copper or copper alloy wires, connectors, and copper circuitry are typically coated with a metallic surface coating. The metallic surface coating may be electrolytically plated onto the copper or copper alloy substrate, deposited by electroless deposition, or deposited by immersion plating. The metallic surface coating typically may comprise one, two, or more than two metallic layers. In embodiments comprising two or more than two metallic layers, the first layer may be described as an underlayer and is typically a base metal layer deposited on a surface of the copper or copper alloy substrate. A metallic layer deposited on a surface of the base metal layer may be referred to as an overlayer. The overlayer is typically a precious metal layer deposited on a surface of the base metal layer. The base metal underlayer may comprise one or more than one base metal, present either as a base metal alloy layer or as two distinct base metal layers. Similarly, the precious metal overlayer may comprise one precious metal, more than one precious metal, or an alloy of a precious metal and a base metal. The precious metal layer may comprise a precious metal alloy layer or two distinct precious metal layers. In those embodiments where the metallic surface coating comprises only one layer, the single layer may comprise either a base metal underlayer or a precious metal layer. The base metal underlayer may comprise a pure base metal coating or a base metal alloy coating with another base metal or a precious metal. Similarly, the precious metal overlayer can comprise a pure precious metal coating or a precious metal alloy coating with another precious metal or a base metal.

Base metals applicable for the underlayer include nickel, tin, zinc, chromium, titanium, aluminum, tantalum, zirconium, hafnium, molybdenum, tungsten, alloys of these metals with each other, and other alloys of each of these metals. Applicable alloys of nickel include nickel-aluminum-titanium, nickel-copper, nickel-copper-aluminum, nickel-chromium-iron, nickel-chromium-cobalt, and nickel-chromium-molybdenum. Applicable alloys of tin include tin-lead; tin-copper; tin-silver; tin-silver-copper; tin-silver-copper-antimony; tin-zinc; tin-zinc-bismuth; tin-antimony; tin-indium-silver-bismuth; tin-bismuth-silver; tin-bismuth; and tin-indium. Base metals may be alloyed with precious metals, typically palladium.

Precious metals applicable for the overlayer include gold, silver, platinum, palladium, and alloys of any of these precious metals with another precious metal. A preferred precious metal coating is gold. An example of a precious metal alloy may be an alloy of gold and palladium. The precious metal overlayer may be as thick as about 1 micron, 2 microns, or more than 2 microns, such as 3 microns, 4 microns, or even 5 microns. Thicker precious metal overlayers may be used in harsh environments, such as areas of high pollution. Thicker precious metal overlays add to the cost of the metallic surface coating. Accordingly, the precious metal overlayer may be thinner than those thicknesses described above, such as about 0.5 micron, about 0.25 micron, or even about 0.1 micron. Accordingly, the precious metal overlayer may be between about 0.1 micron and about 5 microns, preferably between about 0.1 micron and about 1 micron, even more preferably between about 0.25 micron and about 1 micron.

It is known that gold is hardened by the nickel underlayer, so a connector finish comprising a nickel underlayer and a gold overlayer is commonly referred to as a "hardened" or "hard" gold finish. The nickel underlayer can be plated by commercially available chemistries. For electrolytic nickel plating, the SULFAMEX® chemistries available from Enthone Inc. may be used, such as SULFAMEX® MLS. The gold overlayer can be plated by commercially available chemistries, such as the AUTRONEX® chemistries applicable to plating nickel-hardened gold, also available from Enthone Inc. In the context of metallic surface coatings over copper circuitry in PCB, the nickel layer is typically deposited by electroless deposition, followed by immersion gold. In this context, the final finish is referred to as Electroless Nickel-Immersion Gold, or ENIG. The nickel and gold layers may be plated by commercially available chemistries.

In one embodiment, the electronic device comprises a copper or copper alloy substrate coated with a metallic surface coating comprising a base metal layer comprising nickel or nickel alloy. In this embodiment, the metallic surface coating may be surface treated with a composition comprising a phosphorus oxide compound and an aromatic heterocycle comprising nitrogen. Accordingly, application of the surface treating composition to the metallic surface coating using ISOPAR® as the solvent, for example, allows the aromatic heterocycle comprising nitrogen, which may be benzotriazole for example, to penetrate into pores which may be present in the nickel layer. The aromatic heterocycle can react with the copper or copper alloy substrate and form a protective film over the copper or copper alloy substrate and fill in pores in the nickel layer. Further, the phosphorus oxide compound can form a protective organic film over the nickel layer.

In another embodiment, the electronic device comprises a copper or copper alloy substrate coated with a metallic surface coating comprising a base metal underlayer comprising nickel or nickel alloy and a precious metal overlayer comprising gold or gold alloy. In this embodiment, the metallic surface coating may be surface treated with a composition comprising a phosphorus oxide compound and an aromatic heterocycle comprising nitrogen. Accordingly, application of the surface treating composition to the metallic surface coating using ISOPAR® as the solvent, for example, allows the aromatic heterocycle comprising nitrogen, which may be benzotriazole for example, to penetrate into pores which may be present in the nickel layer. The aromatic heterocycle can react with the copper or copper alloy substrate and form a protective film over the copper or copper alloy substrate and fill in pores in the nickel layer. Further, the phosphorus oxide compound can form a protective organic film over the nickel layer and fill in pores that may be present in the gold overlayer. This embodiment is exemplified in FIG. 3.

Figure 5:
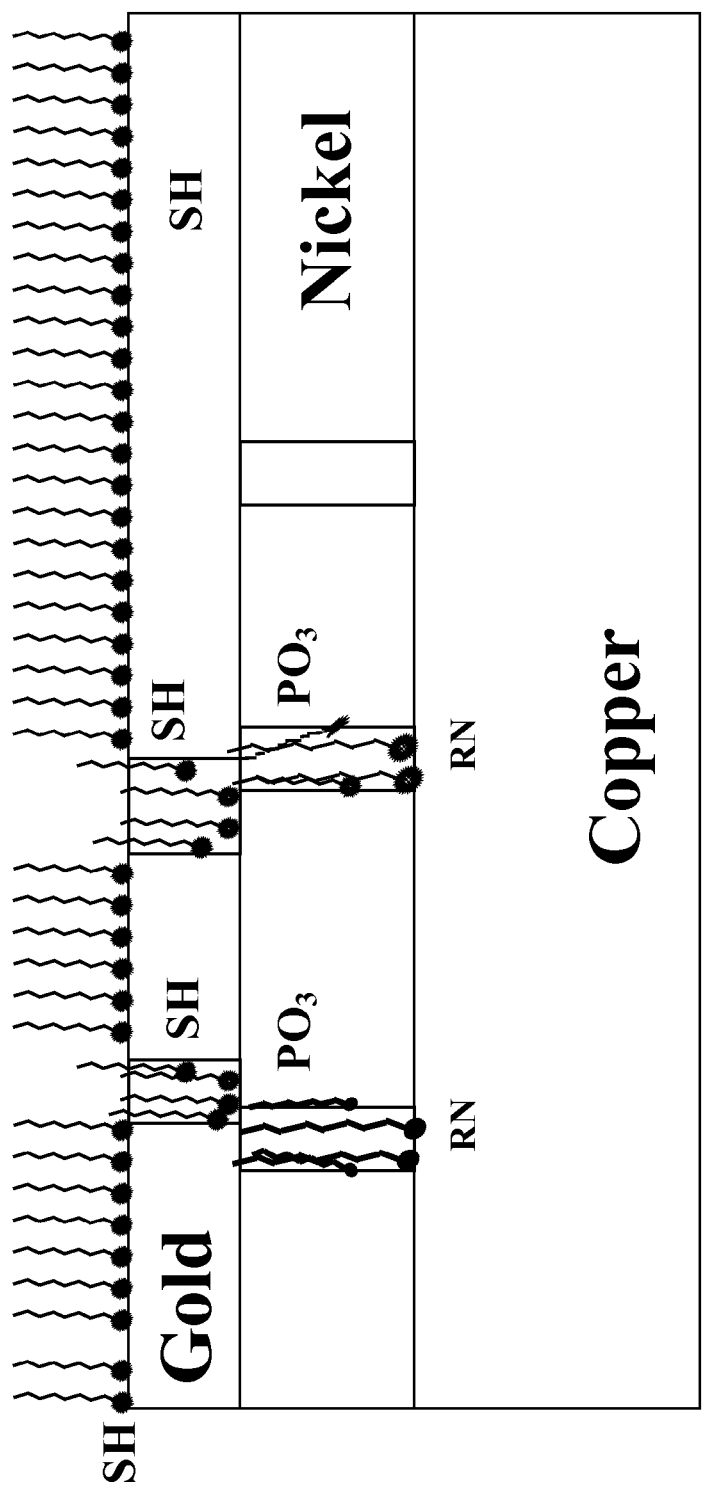
FIG. 5 is a depiction of a phosphorus oxide compound forming a protective film over a nickel underlayer by reacting with nickel oxide which may be present on the surface of the nickel underlayer, an aromatic heterocycle comprising nitrogen forming a protective film over a copper or copper alloy substrate by reacting with surface copper, and an alkyl thiol forming a protective film over a gold overlayer by reacting with surface gold. The phosphorus oxide compound further fills in pores in the gold overlayer and the aromatic heterocycle comprising nitrogen fills in pores in the nickel underlayer.

In yet another embodiment, the electronic device comprises a copper or copper alloy substrate coated with a metallic surface coating comprising a base metal underlayer comprising nickel or nickel alloy and a precious metal overlayer comprising gold or gold alloy. In this embodiment, the metallic surface coating is surface treated with a composition preferably comprising a phosphorus oxide compound, an aromatic heterocycle comprising nitrogen, and an alkyl thiol. The phosphorus oxide compound and aromatic heterocycle comprising nitrogen act to protect the electronic device as explained in the prior embodiment. Addition of the alkyl thiol provides a further means of protecting the electronic device. The alkyl thiol reacts with and forms a protective film over the gold overlayer. Moreover, alkyl thiol can penetrate into pores which may be present in the nickel underlayer to react with and form a protective film over the copper or copper alloy substrate and fill in pores in the nickel underlayer. This embodiment is exemplified in FIG. 5.

Other metallic surface compositions that may be protected using the surface treating composition of the present invention include Cu—Ni—Pd—Au—Sn, Cu—Ni—Pd—Au—Sn, Cu—Ni—Sn, and Cu—Ag.

The surface treating composition of the present invention can be applied to the electronic device by dipping, flooding, or spray immersion, provided that the application method sufficiently wets the surface of the electronic device for a sufficient time for the additives to penetrate into the pores which may be present in the metallic surface coating and form a protective film over the coating.

The duration of exposure is not narrowly critical to the efficacy of the invention and may depend in part on engineering aspects of the process. Typical exposure times may be as little as about 1 second to as long as about 10 minutes, more typically between about 5 seconds and about 180 seconds. In practice, the exposure time may be between about 15 seconds and about 120 seconds, typically between about 15 seconds and about 60 seconds, such as between about 30 seconds and about 60 seconds. In view of these relatively short exposure times, the method of the present invention achieves rapid substrate coating. The temperature of the surface treating composition may vary between about 20° C. up to about 75° C., typically between about 25° C. and about 55° C., such as between about 25° C. and about 45° C. Exposure to the surface treating composition may be enhanced with scrubbing, brushing, squeegeeing, agitation, and stirring. In particular, agitation has been shown to be an effective means of enhancing the ability of the composition to apply a protective organic coating to the substrate. The agitation may be vigorous. After exposing the substrate to the surface treating composition, the substrate may be rinsed, typically with deionized water for between about 10 seconds to about 2 minutes.

The following examples further exemplify the surface treating compositions of the present invention.

EXAMPLES

Example 1

Surface Treating Composition of the Invention

A surface treating composition of the present invention was prepared having the following components:
n-decylphosphonic acid (12.4 g)
benzotriazole (3 g)
ISOPAR-H (to 1 L)

The solution was prepared by adding 12.4 grams of n-decylphosphonic acid and 3.0 grams of benzotriazole to 1 liter of ISOPAR® until all solids completely dissolve.

Comparative Example 1

Conventional Surface Treating Composition

A comparative surface treating composition of the present invention was prepared having the following components:
n-decylphosphonic acid (12.4 g)
ISOPAR-H (to 1 L)

The solution was prepared in a manner similar to that described above in Example 1, except that no benzotriazole was added.

Example 2

Surface Treating Composition of the Invention

A surface treating composition of the present invention was prepared having the following components:
A surface treating composition of the present invention was prepared having the following components:
n-decylphosphonic acid (12.4 g)
benzotriazole (3 g)
n-octadecyl mercaptan (5 g)
ISOPAR-H (to 1 L).

Example 3

Surface Treating Composition of the Invention

A surface treating composition of the present invention was prepared having the following components:
A surface treating composition of the present invention was prepared having the following components:
n-decyl phosphonic acid (1.3 g)
benzotriazole (2.7 g)
ISOPAR-H (685 g)
2-octanol (44 g).

Example 4

Treating Copper Substrate Comprising Nickel Underlayer and Gold Overlayer with Solutions of Example 1 and Comparative Example 1

Three copper coupons (copper alloy 725) were plated with a metallic surface coating. The metallic surface coating comprised a base metal layer comprising nickel (2.5 microns thickness) and a precious metal overlayer comprising gold (0.5 micron thickness). The nickel underlayers were plated using SULFAMEX® MLS, available from Enthone Inc. The gold overlayers were plated with a gold overlayer using AUTRONEX®, available from Enthone Inc. The gold plating was carried out according to the technical brochure provided by Enthone Inc.

After plating nickel/gold surface layers over the copper coupons: (A) one coupon was left untreated, (B) one coupon was treated with the surface treating composition of Comparative Example 1, and (C) one coupon was treated with the surface treating composition of Example 1. Treatment in the compositions of Example 1 and Comparative Example 1 involved dipping the coupons in the composition for 3 minutes while the compositions were heated to a temperature of 45° C.

Example 5

Porosity Testing of Treated and Untreated Copper Substrates having Nickel Underlayer and Gold Overlayer The coupons of Example 4 were subjected to a twenty four hour $SO_2$ porosity test. The porosity test is based on ASTM standard B799. The standard protocol involves exposing the copper coupons to $SO_2$ vapor for 90 minutes followed by exposure to $H_2S$ vapor for 15 minutes. For this example, the standard test was modified by increasing the exposure time to $SO_2$ vapor to 24 hours.

Porosity testing was carried out in two glass desiccators each having an inner diameter of 150 mm. In a first glass desiccator, $SO_2$ vapor was generated from a 6% of sulfurous acid (150 mL). In a second glass desiccator, $H_2S$ vapor was generated from a 23.5% $(NH_4)_2S$ solution (1 mL in 100 mL deionized water). The coupons were tested by exposing them to $SO_2$ vapor in the first glass desiccator for 24 hours and then to $H_2S$ vapor in the second glass desiccator for 15 minutes.

Figure 6C:
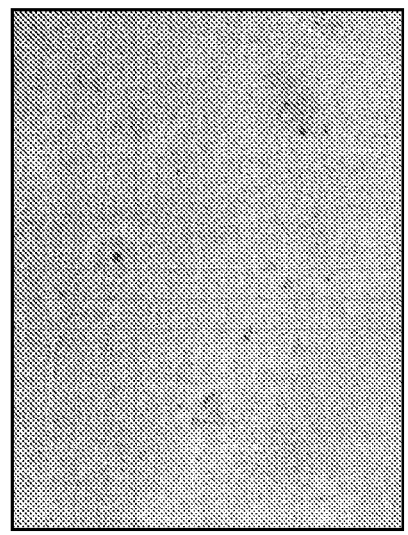
FIGS. 6A, 6B, and 6C are photographs of coupons comprising a copper alloy substrate plated with 2.5 μm of nickel underlayer and 0.5 μm of hard gold overlayer. The coupons were (A) untreated, (B) treated with the conventional surface treating composition of Comparative Example 1, and (C) treated with the surface treating composition of Example 1 and then subjected to a 24-hour $SO_2$ porosity test.
Figure 6B:
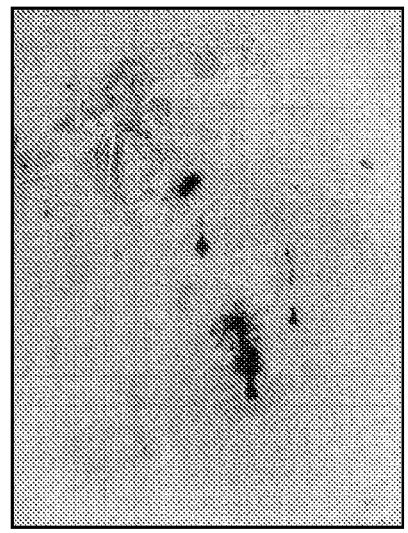
Figure 6A:
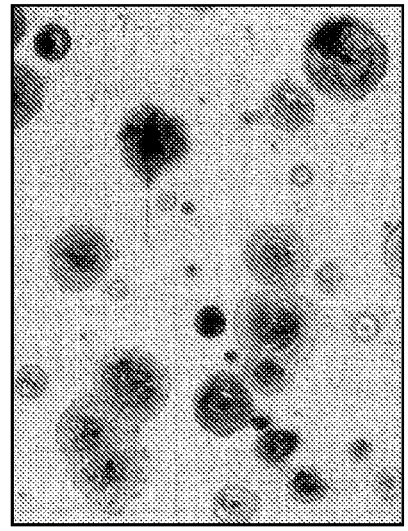

After the test, the coupons were visually inspected for surface corrosion. The results are shown in FIGS. 6A, 6B, and 6C, which are photographs of the coupons. FIG. 6A, which is a photograph of the untreated coupon, shows substantial surface corrosion. FIG. 6B, which is a photograph of the coupon treated with a conventional surface treating composition (Comparative Example 1), shows substantially reduced surface corrosion as compared to the untreated coupon. FIG. 6C, which is a photograph of the coupon treated with a surface treating composition of the present invention (Example 1), shows extremely minor surface corrosion as compared to both the untreated coupon and the coupon treated with the comparative surface treating composition.

Example 6

Porosity Testing of Copper Substrates having Thick and Thin Gold Layers

Copper alloy coupons having an underlayer of nickel and an overlayer of gold thereon were tested for corrosion resistance. The thicknesses of the gold overlayer were varied to determine if thinner gold overlayers can provide sufficient corrosion resistance if treated with the surface treating composition of the present invention. Six copper alloy coupons were plated with a nickel underlayer (2.5 microns thickness). The nickel underlayer was deposited using SULFAMEX® MLS, available from Enthone Inc. The six coupons were plated with a gold overlayer using AUTRONEX, available from Enthone Inc. The gold plating was carried out according to the technical brochure provided by Enthone Inc. The thicknesses of the gold overlayer were varied and the substrates were treated or untreated in a surface treatment composition as shown in the following Table 2:

TABLE 2

| Coupon Designation | Gold Overlayer Thickness | Treatment Conditions |
|---|---|---|
| A | 1.0 micron | Untreated |
| B | 0.5 micron | Untreated |
| C | 0.5 micron | Treated with Composition of Comparative Example 1 |
| D | 0.25 micron | Untreated |
| E | 0.25 micron | Treated with Composition of Comparative Example 1 |
| F | 0.25 micron | Treated with Composition of Example 1 |

Figure 7:
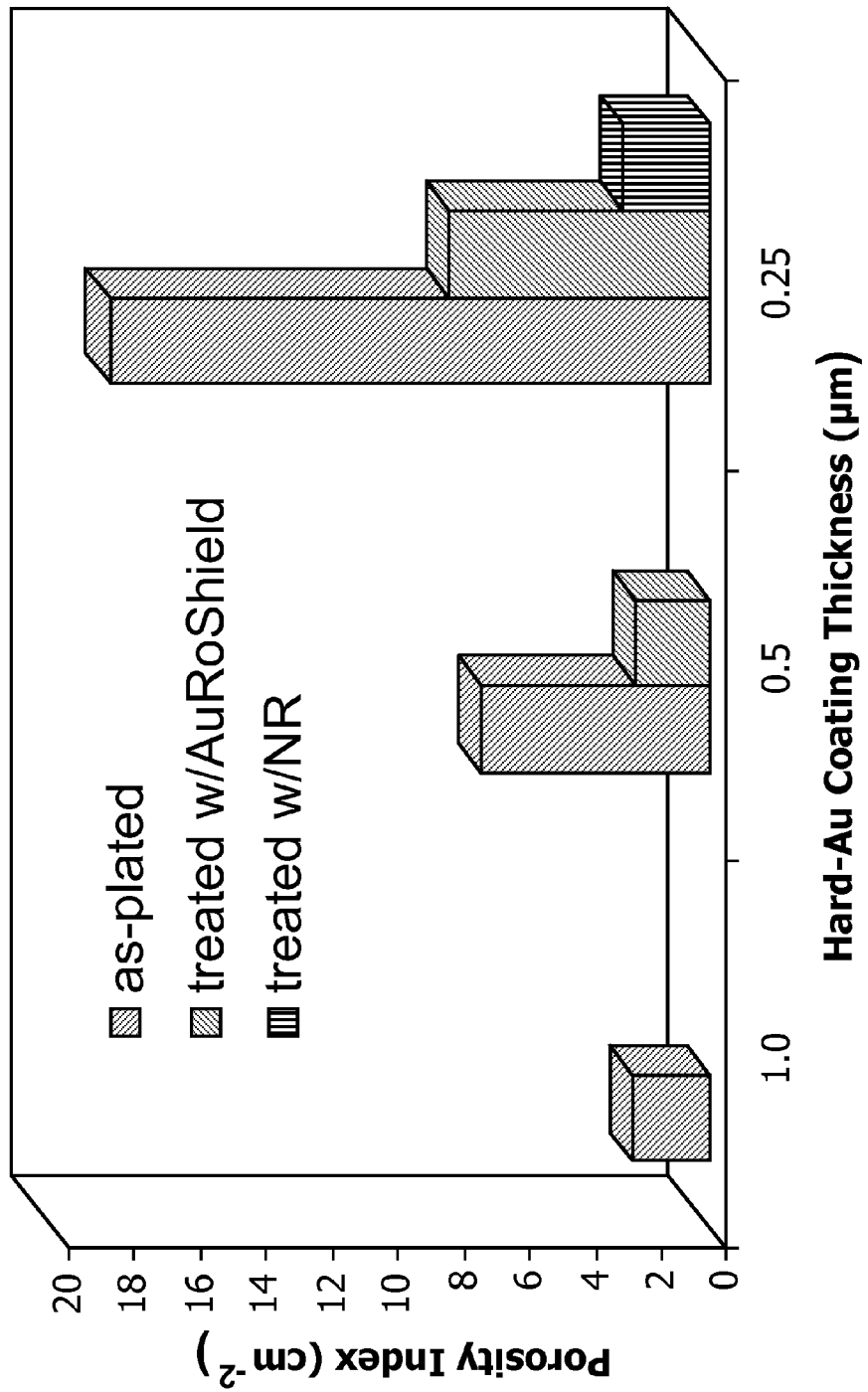
FIG. 7 is a graph showing porosity index as a function of hard gold overlayer overlayer thickness and treatment composition. Samples included untreated metallic surfaces having hard gold layers thicknesses of 1.0 μm, 0.5 μm, and 0.25 μm; metallic surfaces treated with the surface treating composition of Comparative Example 1 having hard gold layers thicknesses of 0.5 μm and 0.25 μm; and a metallic surface treated with the surface treating composition of Example 1 having hard gold layer thickness of 0.25 μm.

After treatment, the six coupons were subjected to the ASTM B799 porosity test similar to that described in Example 5. In this example, the standard was followed, such that the duration of exposure to $SO_2$ vapor was 1.5 hours. After testing, the porosity index of each coupon was determined using either an optical microscope or an SEM. These data were used to construct the graph shown in FIG. 7. From the graph, it is apparent that the copper coupon (F) plated with a very thin 0.25 μm gold overlayer and treated with the composition of Example 1 had a corrosion-resistance, as determined by the porosity index, comparable to that of the untreated copper coupon (A) plated with a 1.0 μm thick hard gold overlayer and the copper coupon (C) plated with a 0.5

µm thick hard gold overlayer and treated with the conventional surface treating composition of Comparative Example 1. By allowing the use of a thinner gold overlayer, manufacturing costs can be reduced.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. For example, that the foregoing description and following claims refer to "a" layer means that there can be one or more such layers. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

We claim:

1. A method for enhancing the corrosion resistance, wear resistance, and contact resistance of a device comprising a copper or copper alloy substrate and at least one metal-based layer on a surface of the substrate, the at least one metal-based layer comprising a base metal layer and a precious metal layer, the precious metal layer having a thickness of less than about 1.0 µm, the method comprising:
   exposing the device to a composition consisting essentially of a phosphorus oxide compound selected from the group consisting of a phosphonic acid, a phosphonate salt, a phosphonate ester, a phosphoric acid, a phosphate salt, a phosphate ester, and mixtures thereof;
   an aromatic heterocycle comprising nitrogen;
   optionally a sulfur containing compound;
   and wherein the phosphorus oxide compound, the aromatic heterocycle comprising nitrogen and optionally a sulfur containing compound are dissolved in a solvent having a surface tension less than about 50 dynes/cm as measured at 25° C.

2. The method of claim 1 wherein the base metal layer comprises a base metal selected from the group consisting of nickel, tin, zinc, chromium, titanium, aluminum, tantalum, zirconium, hafnium, molybdenum, tungsten, and alloys thereof.

3. The method of claim 2 wherein the precious metal layer comprises a precious metal selected from the group consisting of gold, silver, platinum, palladium, and alloys thereof.

4. The method of claim 2 wherein the composition further comprises a thiol having the following structure (IV):

  Structure (IV)

wherein $R_1$ is a hydrocarbyl having between one carbon atom and about 24 carbon atoms.

5. The method of claim 4 wherein the thiol is selected from the group consisting of ethyl mercaptan, n-propyl mercaptan, isopropyl mercaptan, n-butyl mercaptan, sec-butyl mercaptan, isobutyl mercaptan, tert-butyl mercaptan, n-pentyl mercaptan, n-hexyl mercaptan, n-heptyl mercaptan, n-octyl mercaptan, n-nonyl mercaptan, n-decyl mercaptan, n-dodecyl mercaptan, n-tetradecyl mercaptan, n-hexadecyl mercaptan, and n-octadecyl mercaptan.

6. The method of claim 2 wherein the precious metal overlayer has a thickness of less than about 0.5 µm.

7. The method of claim 2 wherein the precious metal overlayer has a thickness of less than about 0.25 µm.

8. The method of claim 1 wherein the phosphorus oxide compound has the structure (I):

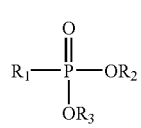  Structure (I)

wherein $R_1$ is a hydrocarbyl having between two and 24 carbon atoms; and $R_2$ and $R_3$ are each independently or together hydrogen, a charge balancing cation, or a hydrocarbyl having between one carbon atom and four carbon atoms.

9. The method of claim 8 wherein the phosphorus oxide compound is selected from the group consisting of n-decyl phosphonic acid, n-dodecyl phosphonic acid, n-tetradecyl phosphonic acid, n-hexadecyl phosphonic acid, n-octadecyl phosphonic acid, their salts, and their esters.

10. The method of claim 1 wherein the phosphorus oxide compound has the structure (II):

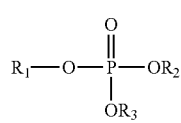  Structure (II)

wherein $R_1$ is a hydrocarbyl having between two and 24 carbon atoms; and $R_2$ and $R_3$ are each independently or together hydrogen, a charge balancing cation, or a hydrocarbyl having between one carbon atom and four carbon atoms.

11. The method of claim 1 wherein the phosphorus oxide compound is selected from the group consisting of n-decyl phosphoric acid, n-dodecyl phosphoric acid, n-tetradecyl phosphoric acid, n-hexadecyl phosphoric acid, n-octadecyl phosphoric acid, their salts, and their esters.

12. The method of claim 1 wherein the aromatic heterocycle comprising nitrogen has the following structure (III):

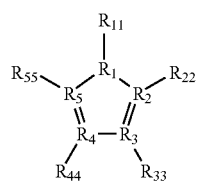  Structure (III)

wherein $R_1$, $R_2$, $R_3$, $R_4$, and $R_5$ is an atom selected from the group consisting of carbon and nitrogen wherein between one and four of the $R_1$, $R_2$, $R_3$, $R_4$, and $R_5$ groups are nitrogen and between one and four of the $R_1$, $R_2$, $R_3$, $R_4$, and $R_5$ groups are carbon; and $R_{11}$, $R_{22}$, $R_{33}$, $R_{44}$, and $R_{55}$ are each independently selected from the group consisting of hydrogen, carbon, sulfur, oxygen, and nitrogen.

13. The method of claim 12 wherein any one or more of $R_{11}$, $R_{22}$, $R_{33}$, $R_{44}$, and $R_{55}$ is carbon, and the carbon is part of an aliphatic group having between one carbon atom and 24 carbon atoms or part of an aryl group having between two carbon atoms and fourteen carbon atoms.

14. The method of claim 12 wherein any two consecutive $R_{11}$, $R_{22}$, $R_{33}$, $R_{44}$, and $R_{55}$ together with the carbon or nitrogen atoms to which they are bonded form a six-membered aromatic ring.

15. The method of claim 12 wherein the aromatic heterocycle comprising nitrogen is selected from the group consisting of pyrrole (1H-azole); imidazole (1,3-diazole); pyrazole (1,2-diazole); 1,2,3-triazole; 1,2,4-triazole; tetrazole; isoindole; benzimidazole (1,3-benzodiazole); indazole (1,2-benzodiazole); 1H-benzotriazole; 2H-benzotriazole; imidazo[4,5-b]pyridine; indole (1H-Benzo[b]pyrrole); purine (7H-Imidazo(4,5-d)pyrimidine); pyrazolo[3,4-d]pyrimidine; Triazolo[4,5-d]pyrimidine; and combinations thereof.

16. The method of claim 12 wherein the aromatic heterocycle comprising nitrogen is selected from the group consisting of imidazole (1,3-diazole), benzimidazole (1,3-benzodiazole), 1H-benzotriazole, and 2H-benzotriazole.

17. The method of claim 1 wherein a concentration of the phosphorus oxide compound is between about 0.1% by weight and about 5% by weight and a concentration of the aromatic heterocycle comprising nitrogen is between about 0.1% by weight and about 1.0% by weight.

18. The method of claim 1 wherein the solvent has a surface tension less than about 40 dynes/cm as measured at 25° C.

19. The method of claim 1 wherein the solvent has a surface tension less than about 35 dynes/cm as measured at 25° C.

20. The method of claim 1 wherein the solvent has a surface tension less than about 30 dynes/cm as measured at 25° C.

21. The method of claim 1 wherein the solvent is a paraffinic mineral oil solvent or an isoparaffinic mineral oil solvent.

22. The method of claim 21 wherein the solvent has a surface tension less than about 30 dynes/cm as measured at 25° C.

23. A method for enhancing the corrosion resistance, wear resistance, and contact resistance of a device comprising a copper or copper alloy substrate and at least one metal-based layer on a surface of the substrate, the at least one metal-based layer comprising a base metal layer and a precious metal layer, the precious metal layer having a thickness of less than about 1.0 μm, the method comprising:
 exposing the device to a composition consisting essentially of a phosphorus oxide compound selected from the group consisting of a phosphonic acid, a phosphonate salt, a phosphonate ester, a phosphoric acid, a phosphate salt, a phosphate ester, and mixtures thereof;
 an aromatic heterocycle comprising nitrogen;
 optionally a sulfur containing compound;
 and wherein the phosphorus oxide compound, the aromatic heterocycle comprising nitrogen and optionally a sulfur containing compound are dissolved in a solvent having a surface tension less than about 50 dynes/cm as measured at 25° C., wherein the solvent is a naphthenic oil solvent.

24. A method for enhancing the corrosion resistance, wear resistance, and contact resistance of a device comprising a copper or copper alloy substrate and at least one metal-based layer on a surface of the substrate, the at least one metal-based layer comprising a base metal layer and a precious metal layer, the precious metal layer having a thickness of less than about 1.0 μm, the method comprising:
 exposing the device to a composition consisting essentially of a phosphorus oxide compound selected from the group consisting of a phosphonic acid, a phosphonate salt, a phosphonate ester, a phosphoric acid, a phosphate salt, a phosphate ester, and mixtures thereof;
 an aromatic heterocycle comprising nitrogen;
 optionally a sulfur containing compound;
 and wherein the phosphorus oxide compound, the aromatic heterocycle comprising nitrogen and optionally a sulfur containing compound are dissolved in a solvent having a surface tension less than about 50 dynes/cm as measured at 25° C., wherein the solvent is an alcohol having a boiling point of at least about 90° C.

25. The method of claim 24 wherein the solvent has a surface tension less than about 40 dynes/cm as measured at 25° C.

26. The method of claim 24 wherein the solvent has a surface tension less than about 35 dynes/cm as measured at 25° C.

27. The method of claim 24 wherein the alcohol has a boiling point of at least about 110° C.

28. A method for enhancing the corrosion resistance, wear resistance, and contact resistance of a device comprising a copper or copper alloy substrate and at least one metal-based layer on a surface of the substrate, the method comprising:
 exposing the device to a composition consisting essentially of a phosphorus oxide compound selected from the group consisting of a phosphonic acid, a phosphonate salt, a phosphonate ester, a phosphoric acid, a phosphate salt, a phosphate ester, and mixtures thereof;
 an aromatic heterocycle comprising nitrogen;
 a disulfide having the following structure (V):

R1-S—S—R2    Structure (V)

wherein R1 and R2 are hydrocarbyls having between one carbon atom and about 24 carbon atoms;
 and wherein the phosphorus oxide compound, the aromatic heterocycle comprising nitrogen and the disulfide are dissolved in a solvent having a surface tension less than about 50 dynes/cm as measured at 25° C., wherein the solvent is an alcohol having a boiling point of at least about 90° C.

29. The method of claim 28 wherein the disulfide is selected from the group consisting of diethyl disulfide, di-n-propyl disulfide, diisopropyl disulfide, di-n-butyl disulfide, di-sec-butyl disulfide, diisobutyl disulfide, di-tert-butyl disulfide, di-n-pentyl disulfide, di-n-hexyl disulfide, di-n-heptyl disulfide, di-n-octyl disulfide, di-n-nonyl disulfide, di-n-decyl disulfide, di-n-dodecyl disulfide, di-n-tetradecyl disulfide, di-n-hexadecyl disulfide, and di-n-octadecyl disulfide.

* * * * *